(12) United States Patent
Sato et al.

(10) Patent No.: US 7,154,752 B2
(45) Date of Patent: Dec. 26, 2006

(54) OPTICAL MODULE AND OPTICAL HUB SYSTEM

(75) Inventors: Shunsuke Sato, Yokohama (JP); Ichiro Tonai, Yokohama (JP); Kazushige Oki, Yokohama (JP); Toshio Mizue, Yokohama (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 161 days.

(21) Appl. No.: 10/655,613

(22) Filed: Sep. 5, 2003

(65) Prior Publication Data

US 2004/0190264 A1    Sep. 30, 2004

(30) Foreign Application Priority Data

Sep. 5, 2002    (JP)    ............... P2002-260475
Sep. 27, 2002    (JP)    ............... P2002-283975

(51) Int. Cl.
*H05K 7/20*    (2006.01)
(52) U.S. Cl. ............. 361/715; 361/760; 361/749; 361/785; 385/135; 385/137
(58) Field of Classification Search ............. 361/715, 361/760, 761, 720, 736, 748, 749, 785; 385/135, 385/137
See application file for complete search history.

(56) References Cited

U.S. PATENT DOCUMENTS

| 6,335,869 | B1 | 1/2002 | Branch et al. | |
| 6,517,382 | B1 * | 2/2003 | Flickinger et al. | 439/607 |
| 6,530,785 | B1 * | 3/2003 | Hwang | 439/76.1 |
| 6,556,445 | B1 * | 4/2003 | Medina | 361/728 |
| 6,600,611 | B1 | 7/2003 | Inujima et al. | |
| 6,830,383 | B1 | 12/2004 | Huang | |
| 6,840,680 | B1 * | 1/2005 | Chiu et al. | 385/53 |
| 6,881,095 | B1 * | 4/2005 | Murr et al. | 439/607 |
| 6,893,168 | B1 | 5/2005 | Huang et al. | |
| 2002/0154362 | A1 | 10/2002 | Oki et al. | |
| 2003/0063424 | A1 | 4/2003 | Inujima et al. | |

FOREIGN PATENT DOCUMENTS

| JP | 61-149129 | 9/1986 |
| JP | 2-17862 | 2/1990 |
| JP | 5-291693 | 11/1993 |
| JP | 2001-091795 | 4/2001 |
| JP | 2002-15450 | 1/2002 |

OTHER PUBLICATIONS

Office action issued in U.S. Appl. No. 10/655,589 on Feb. 7, 2006.

* cited by examiner

*Primary Examiner*—Kamand Cuneo
*Assistant Examiner*—Hung S. Bui
(74) *Attorney, Agent, or Firm*—McDermott Will & Emery LLP

(57) ABSTRACT

An optical module is inserted into a cage containing a connector electrically connected to a conductive wiring on a host board. The cage, the connector and the conductive wiring is provided on the host board. The optical module includes a circuit board and a housing. The circuit board has a card edge connector at an edge thereof. The card edge connector mates with the connector on the host board. The housing has a conductive ceiling with a rear edge and builds the circuit board therein. The conductive ceiling has a stopper supported thereby and protrudes therefrom. The stopper extrudes from the edge of the circuit board and the rear edge of the conductive ceiling.

7 Claims, 19 Drawing Sheets

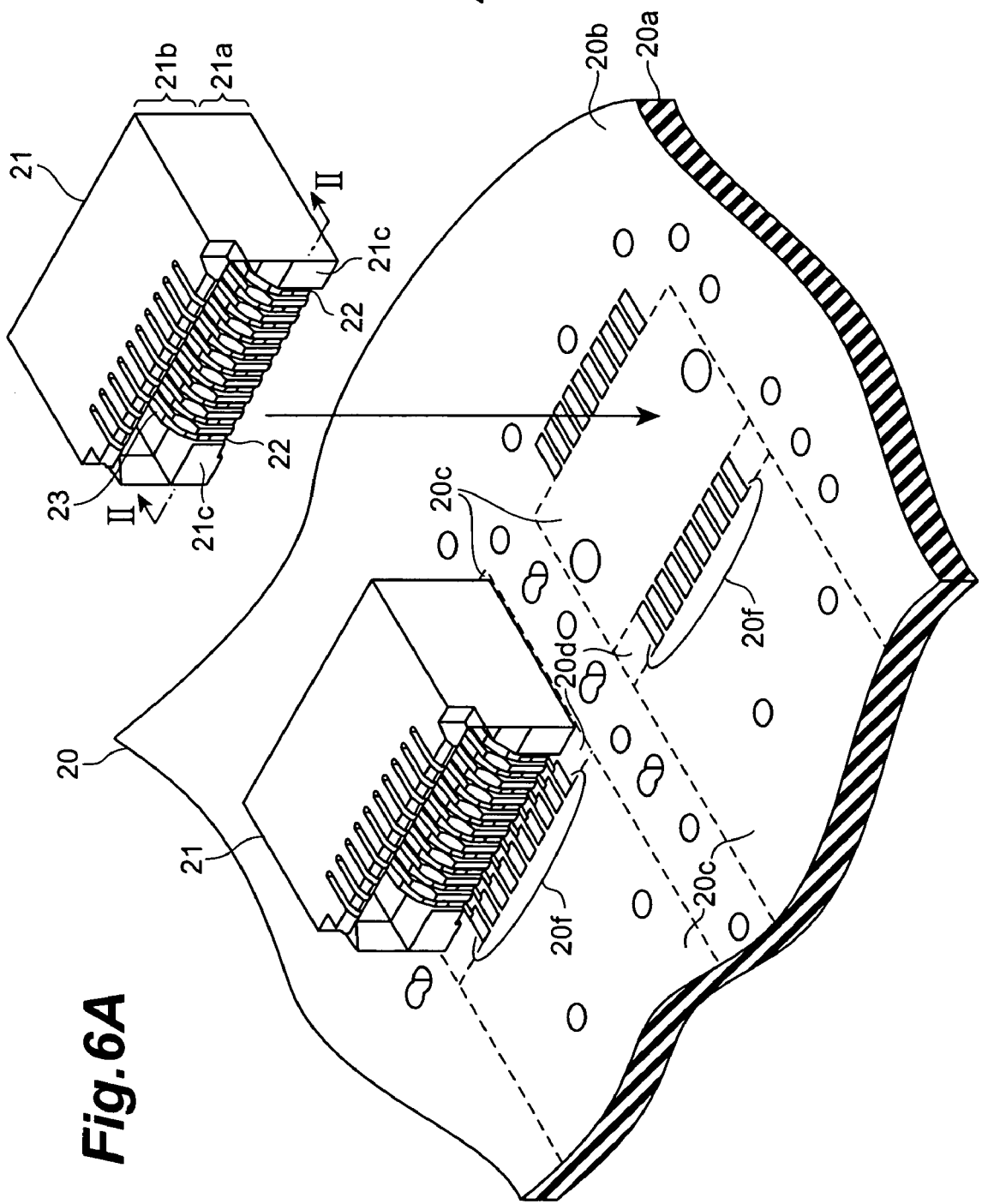

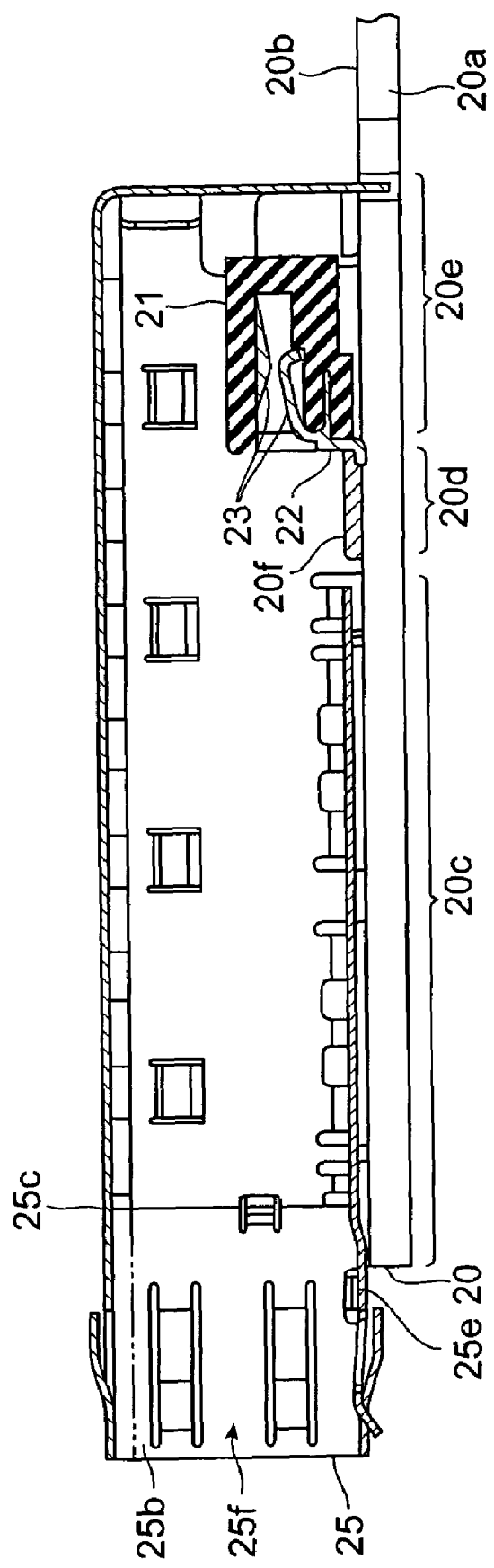

OPTICAL MODULE AND OPTICAL HUB SYSTEM

BACKGROUND OF THE INVENTION

1. Field of the Invention

The present invention relates to an optical module and an optical hub system.

2. Related Background Art

Publication (U.S. Pat. No. 6,335,869) discloses a transceiver module. This optical module is inserted into a cage provided on a host board. A circuit board in the optical module is electrically and mechanically connected to a connector provided on the hostboard. The optical module has a cover for suppressing the radiation of electromagnetic waves.

Such a transceiver module is used in a cage by inserting the transceiver module thereinto and, however, the transceiver module can be inserted upside down thereinto. When the optical module is inserted upside down in the cage, a metal cover of the optical module may come into contact with a conductive pattern provided on the host board, thereby causing a short circuit in the host board.

SUMMARY OF THE INVENTION

It is an object of the present invention to provide an optical module which prevents a short circuit from occurring therethrough in a host board when the optical module is inserted upside down in a cage on the host board.

One aspect of the present invention is an optical module inserted into a cage containing a connector electrically connected to a conductive wiring on a host board, and the cage, the connector and the conductive wiring is provided on the host board. The optical module comprises a circuit board and a housing. The circuit board has a card edge connector at an edge thereof. The card edge connector mates with the connector on the host board. The housing has a conductive ceiling with a rear edge and builds the circuit board therein. The conductive ceiling has a stopper supported thereby and protruding therefrom. The stopper extrudes from the edge of the circuit board and the rear edge of the conductive ceiling.

The stopper is provided between the conductive ceiling and the circuit board.

A distance from the stopper to the rear edge of the conductive ceiling is greater than a length of an exposed portion of the conductive wiring provided on the host board.

The housing further comprises a first projection and a second projection, and the stopper has one end connected to the first projection and another end connected to the second projection. The first projection, the second projection and the stopper are integrally formed.

The first projection is provided in one of the pair of sides and the second projection is provided in the other of the pair of sides.

In the optical module as above, the first projection and the second projection are provided in the conductive ceiling.

Another aspect of the present invention is an optical module inserted into a cage containing a connector electrically connected to a conductive wiring on a host board, and the cage, the connector and the conductive wiring is provided on the host board. The optical module comprises a circuit board and a housing. The circuit board has a card edge connector at an edge thereof. The card edge connector mates with the connector on the host board. The housing has a conductive ceiling with an insulating portion and builds the circuit board therein. An edge of the insulating portion of the conductive ceiling extrudes from the edge of the circuit board.

A width of the insulating portion is greater than a length of an exposed portion of the conductive wiring provided on the host board.

The insulating portion of the conductive ceiling is an insulating film coated on the conductive ceiling.

According to still another aspect of the present invention, an optical hub system comprises a host board, a cage and an optical module. The host board has a conductive wiring provided thereon. The cage contains a connector therein and is provided on the host board. The optical module is inserted into the cage. The optical module includes a circuit board and a housing. The circuit board has a card edge connector at an edge thereof, and the card edge connector mates with the connector in the cage. The housing builds the circuit board therein and has a conductive ceiling with a rear edge, and the conductive ceiling has a stopper supported thereby and protruding therefrom. The stopper extrudes from the edge of the circuit board and the rear edge of the conductive ceiling.

The stopper is provided between the conductive ceiling and the circuit board.

A distance from the stopper to the rear edge of the conductive ceiling is greater than a length of an exposed portion of the conductive wiring provided on the host board.

The connector in the cage further comprises a base portion and a connector portion supported by the base portion. The connector portion has an electrode connected to the card edge connector of the optical module, and the base portion has a front with a plurality of grooves and lead terminals provided in respective grooves. The electrode in the connector portion is connected to the conductive wiring on the host board through the lead terminals.

BRIEF DESCRIPTION OF THE DRAWINGS

FIG. 6A is a view showing a host board and a host connector, whereas FIG. 6B is a sectional view showing the front end face of the host connector taken along the line II—II of FIG. 6A;

FIG. 7 is a sectional view showing the host board and host connector;

FIG. 12A is a view showing a cage and the optical module inserted upside down therein, whereas

FIG. 13A is a view showing the cage and the optical module inserted therein upside down according to the first embodiment, whereas

FIG. 15A is a view showing the rear of the optical module according to the first embodiment, whereas

DETAILED DESCRIPTION OF THE PREFERRED EMBODIMENTS

Embodiments of the present invention will be explained with reference to the drawings. When possible, parts identical or similar to each other will be referred to with numerals identical to each other.

First Embodiment

Figure 1:
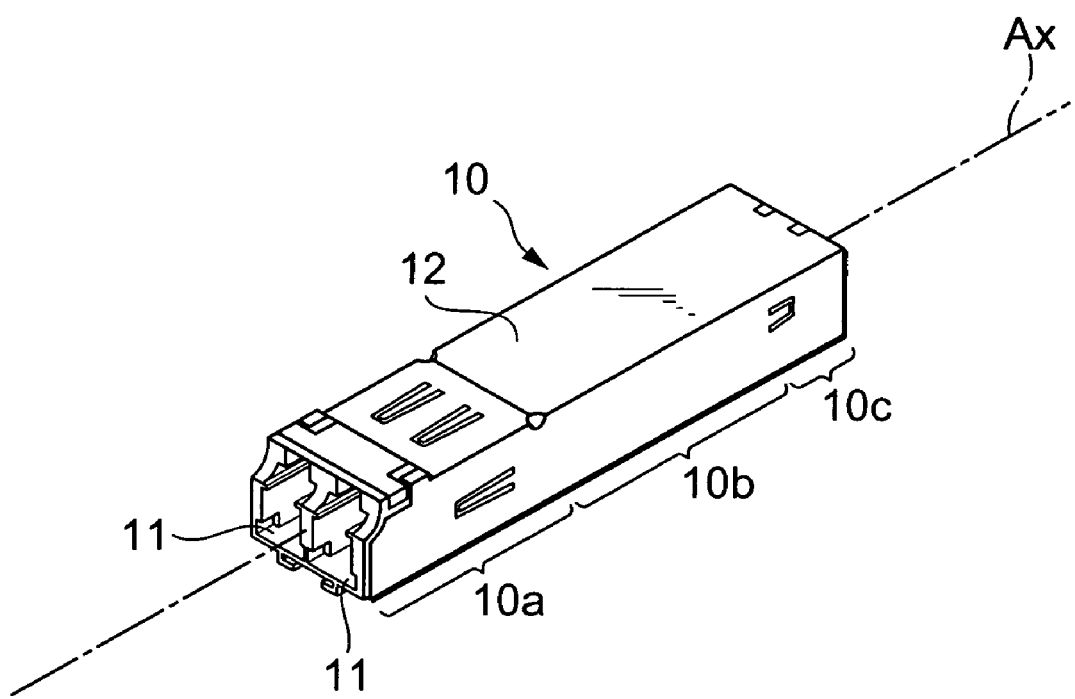
FIG. 1 is a perspective view showing the optical module according to a first embodiment.
Figure 2:
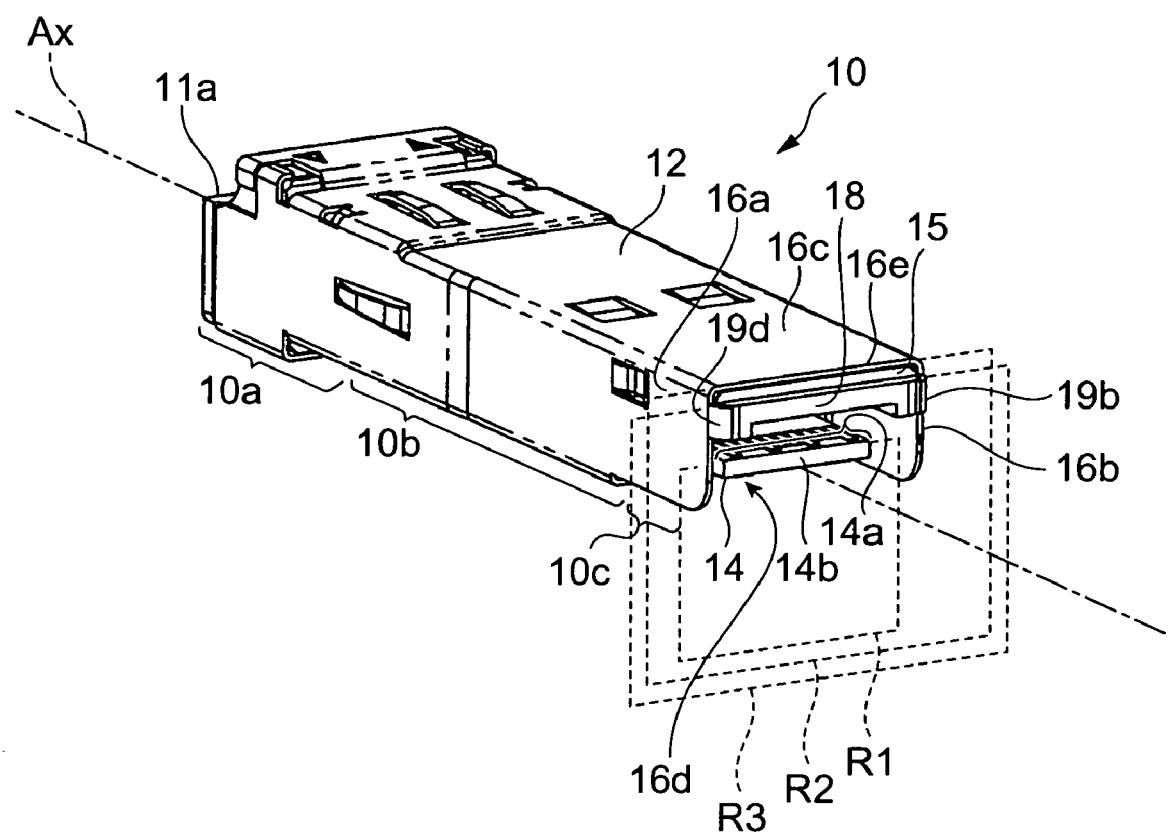
FIG. 2 is a perspective view showing the optical module according to the first embodiment.
Figure 3:
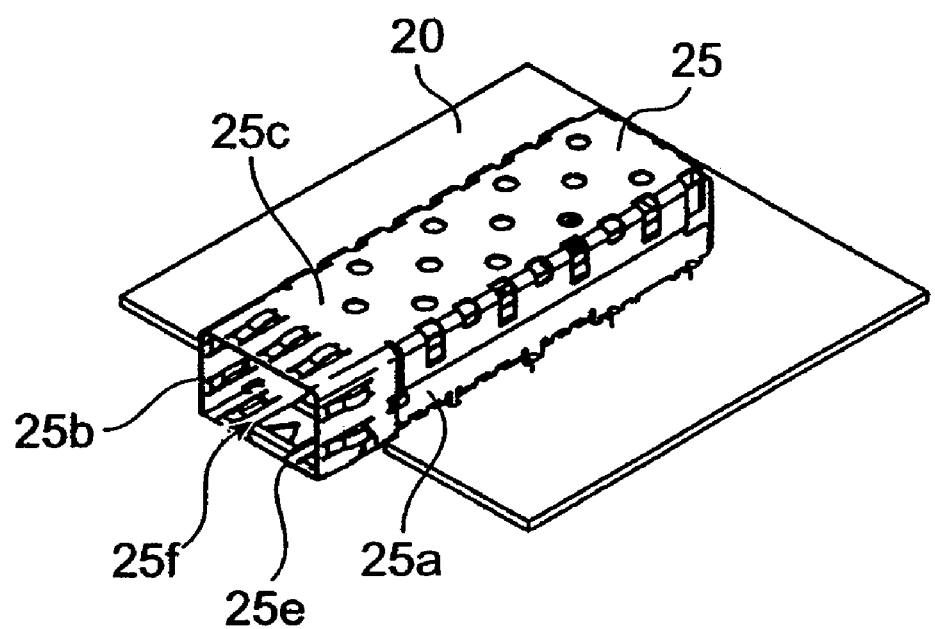
FIG. 3 is a perspective view showing a host device.
Figure 4:
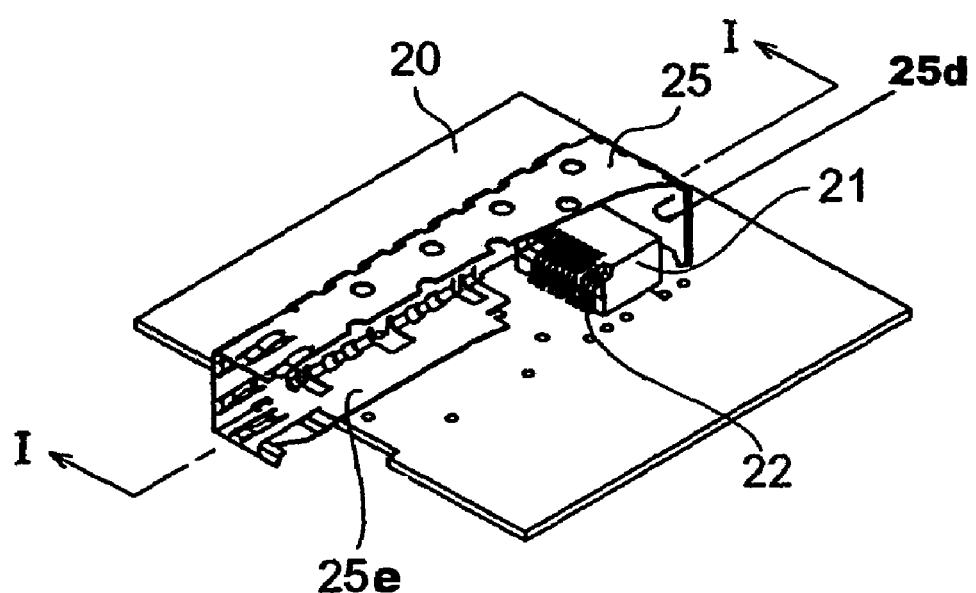
FIG. 4 is a perspective view showing the host device.
Figure 5:
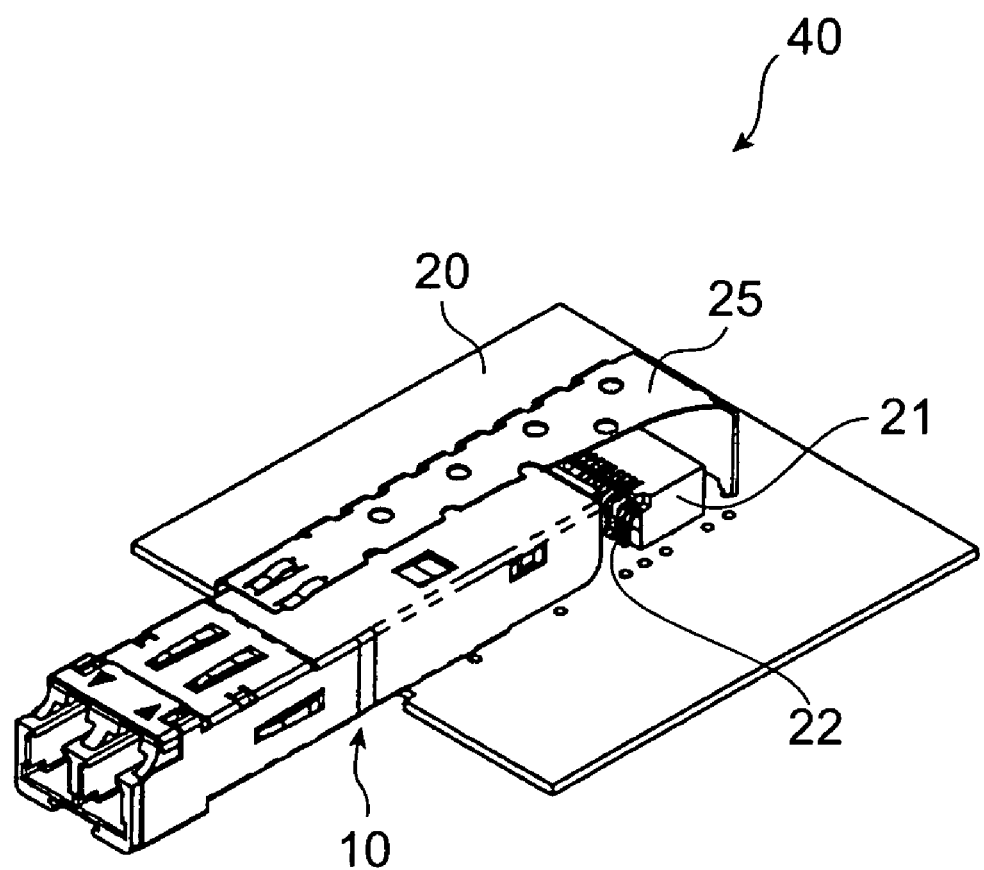
FIG. 5 is a perspective view showing the optical module inserted in the cage.

FIG. 1 is a perspective view showing an optical module according to a first embodiment. FIG. 2 is a perspective view showing the optical module according to this embodiment. FIGS. 3 and 4 are perspective views each showing a cage into which the optical module is inserted. In FIG. 4, the outer structure of the cage 25 is partly removed in order to show the interior of the cage 25. FIG. 5 is a perspective view showing the optical module. The outer structure of the cage 25 is partly removed in FIG. 5 in order to show the optical module 10.

As shown in FIGS. 3 and 4, a connector 21 and a metal cage 25 are provided on a host board 20, whereas the cage 25 covers the connector 21. The cage 25 includes side walls 25a and 25b, a ceiling 25c, a rear wall 25d, and a bottom 25e. These portions 25a to 25e are integrally formed with each other. The cage 25 has an opening 25f for receiving the optical module 10 therein. As shown in FIG. 4, the bottom 25e of the cage 25 also has an opening in which the connector 21 is located. The connector 21 has leads 22 soldered to the host board 20, and is electrically connected to the host board 20 via the leads 22. Referring to FIG. 5, the optical module 10 is connected to the connector 21 provided on a circuit board, such as the host board 20, in an optical hub system 40.

As shown in FIGS. 1 and 2, the optical module 10 includes a housing 12 and a circuit board 14. The optical module 10 has a front portion 10a, a primary portion 10b, and a rear portion 10c. The housing 12 includes a metal cover 16. The cover 16 includes a pair of side walls 16a and 16b and a ceiling 16c. These portions 16a to 16c are formed integrally. The rear of the housing 12 has an opening 16d for receiving the connector 21 therein. The circuit board 14 has a card edge connector 14a provided to be connected with the connector 21. The optical module 10 has a stopper 18 formed integrally with the cover 16. The stopper 18 is provided at the rear portion 10c of the optical module 10.

As shown in FIG. 2, the rear edge 14b of the circuit board 14 is located on a first reference plane R1. The rear edge 16e of the ceiling 16c is located on a second reference plane R2. The stopper 18 is located on a third reference plane R3. The third reference plane R3 is behind the first reference plane R1 and the second reference plane R2.

If the optical module 10 is inserted upside down into the cage 25, the stopper 18 abuts against the connector 21 before the rear edge 16e of the ceiling 16c reaches a conductive pattern on the host board 20. The stopper 18 can prevent the ceiling 16c from coming into contact with the conductive pattern.

FIG. 6A is a view showing components provided on the host board. FIG. 6B is a sectional view showing the front of the host connector taken along the line II—II of FIG. 6A. FIG. 7 is a view showing the host board taken along the line I—I of FIG. 4.

The host board 20 has an insulating substrate 20a. The substrate 20a includes a primary surface 20b having first to third areas 20c, 20d and 20e. Conductive patterns 20f are provided on the second area 20d. The connector 21 is provided on the third area 20e. The leads 22 of the connector 21 are connected to the conductive patterns 20f, respectively.

The optical module 10 is inserted through the opening 25f of the cage 25 and is mated with the connector 21. After the optical module has been mated with the connector 21, the optical module 10 can receive electrical power through the connector 21 and work. Upon this mating, the electrically conductive cover 16 of the optical module 10 does not come into contact with the leads 22 of the connector 21 and the conductor pattern 20f of the host board 20. Therefore, the optical module 10 can be used as a hot-swappable or hot-pluggable optical module.

As shown in FIG. 6A, the host connector 21 includes a base portion 21a and a connector portion 21b. The connector portion 21b includes electrodes 23 which are connected with the card edge connector 14a of the circuit board 14 in the optical module 10. The base portion 21a has an electrically insulating front face 21c, a plurality of grooves 21e provided in the front face 21c, and the leads 22 provided in the respective grooves 21e. The leads 22 connect the electrodes 23 in the connecting portion 21b to the conductive patterns 20f on the host board. A plurality of projections 21d are provided to form the grooves 21e.

Since the base portion 21a has the projections 21d, the stopper 18 of the optical module 10 abuts against the projections 21d and prevents the cover of the optical module from coming into contact with the leads 22 provided on the front 21c of the host connector 21 when the upside-down optical module 10 reaches the connector 21.

Figure 8A:
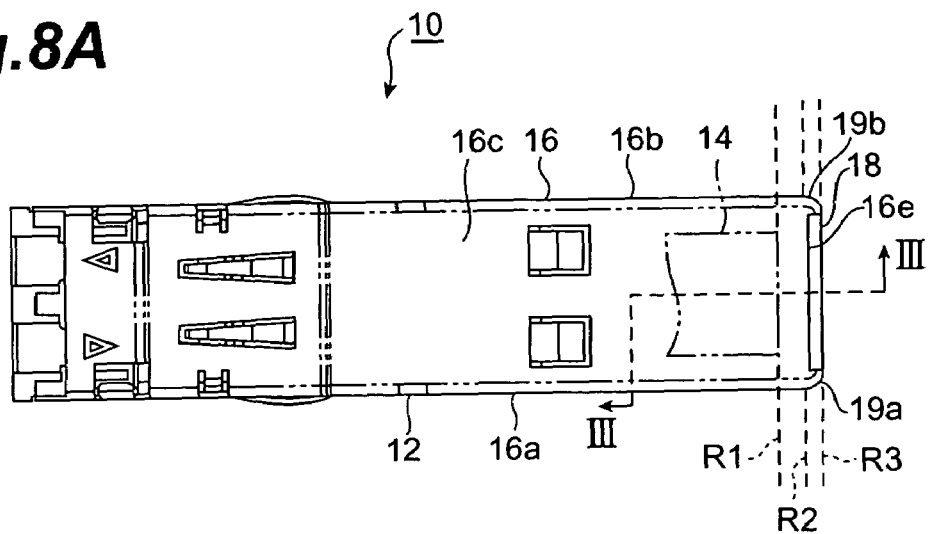
FIG. 8A is a plan view showing the optical module.
Figure 8B:
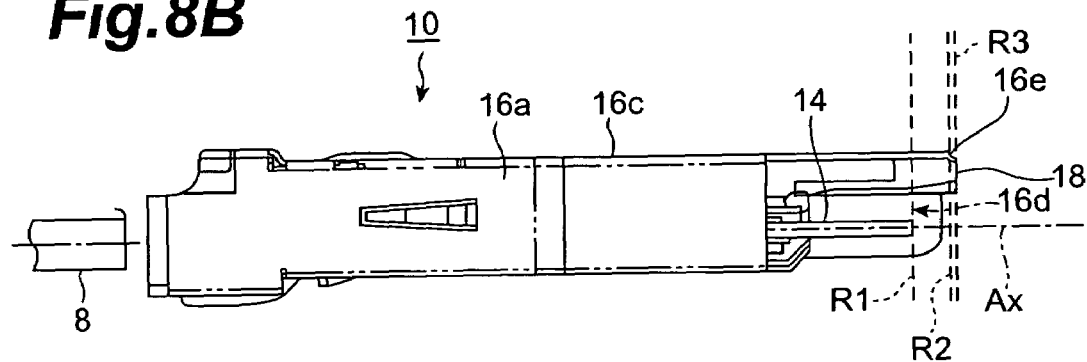
FIG. 8B is a partial sectional view showing the optical module taken along the line III—III of FIG. 8A.
Figure 8C:
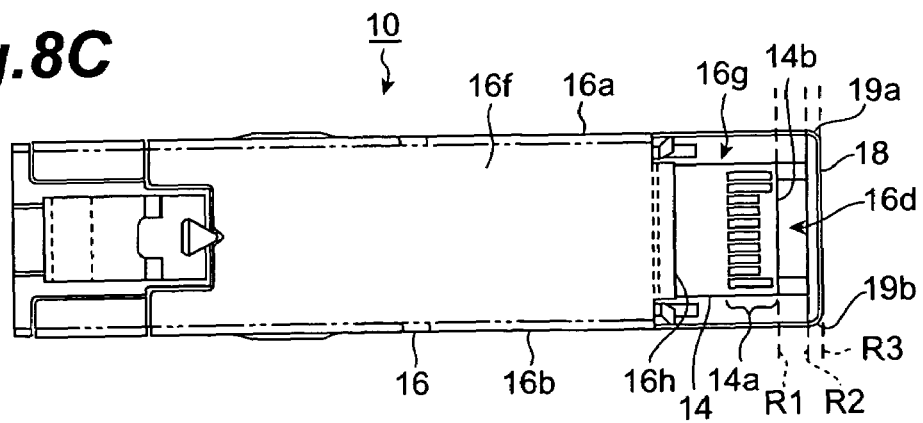
FIG. 8C is a bottom view showing the optical module.

FIG. 8A is a plan view showing the optical module. FIG. 8B is a sectional view showing the optical module taken along the line III—III of FIG. 8A. FIG. 8C is a bottom view showing the optical module.

Referring to FIGS. 8A and 8C, the cover 16 has first and second projections 19a and 19b. The side walls 16a and 16b are provided with the projections 19a and 19b, respectively. One end of the stopper 18 is connected to one projection 19a, whereas the other end of the stopper 18 is connected to the other projection 19b. The stopper 18 is formed integrally with the cover 16. The stopper 18 is projected outward from the rear ends of the side walls 16a and 16b.

If the optical module 10 is inserted upside down into the cage 25, the stopper 18 abuts against the connector 21 before the rear end 16e of the ceiling 16c contacts with the connector 21. If the optical module 10 is inserted into the cage 25 in the correct orientation, the stopper 18 does not contact with the connector 21 and the circuit board 14 in the optical module 10 is mated with the connector 21.

Referring to FIG. 8B, the stopper 18 is provided between the ceiling 16c of the optical module and the circuit board 14. The rear end of the cover 16 has the opening 16d for receiving the connector 21.

Figure 9:
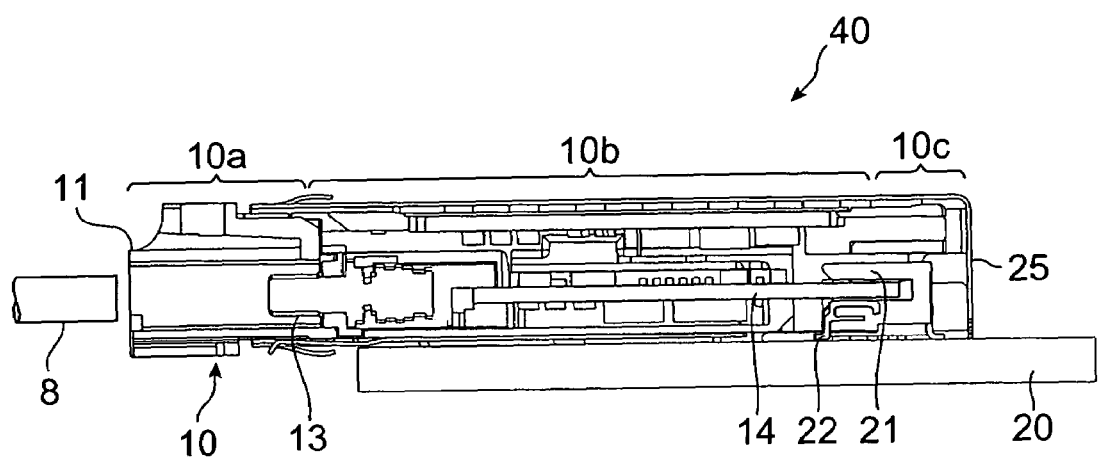
FIG. 9 is a sectional view showing the host board and the optical module connected thereto.

FIG. 9 is a sectional view showing the optical module mated to the host connector. In a preferred example, the optical module 10 can be an optical transceiver having two insertion holes 11 which receives an optical connector 8 therein for transmitting and receiving light. However, the present invention is not limited thereto, and the optical module according to the present invention can be either an optical transmitting module including a plurality of optical transmitting subassemblies or an optical receiving module including a plurality of optical receiving subassemblies.

Figure 10:
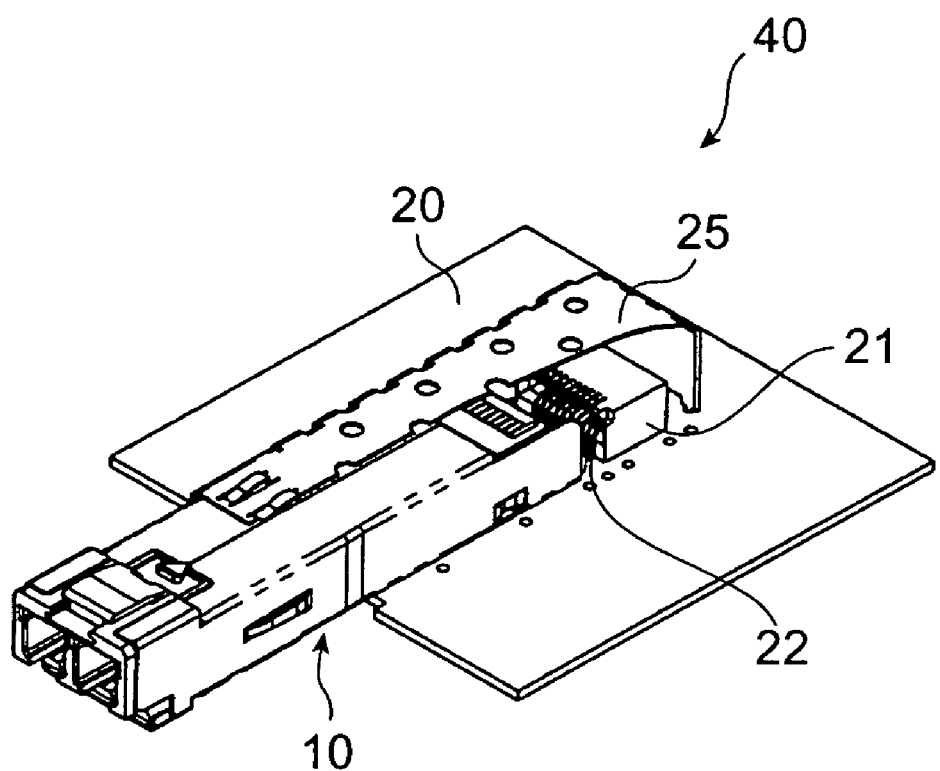
FIG. 10 is a perspective view showing the optical module inserted upside down into the cage.
Figure 11:
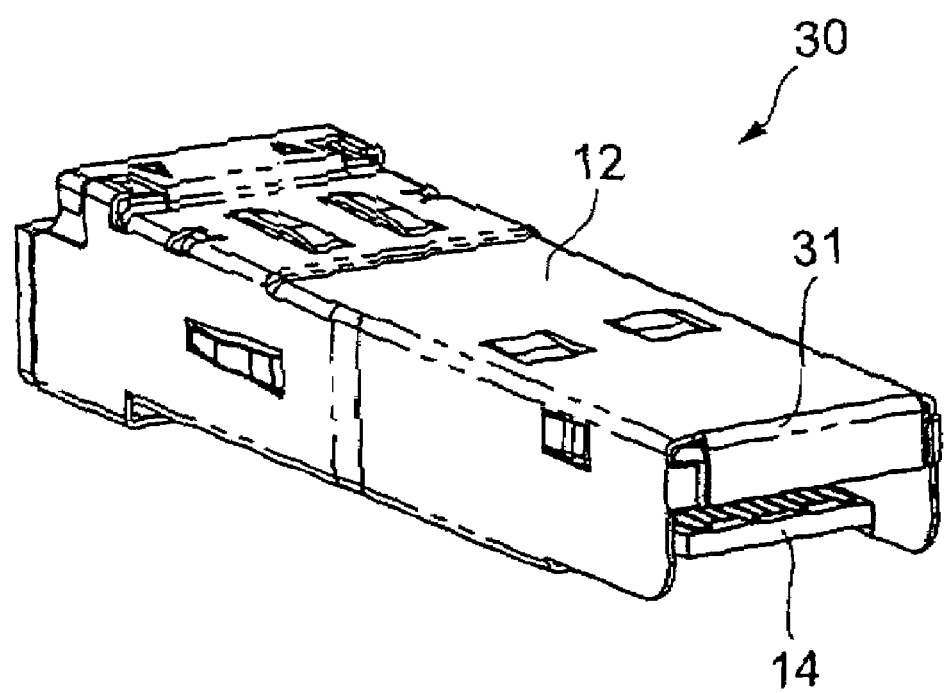
FIG. 11 is a perspective view showing an optical module.
Figure 12A:
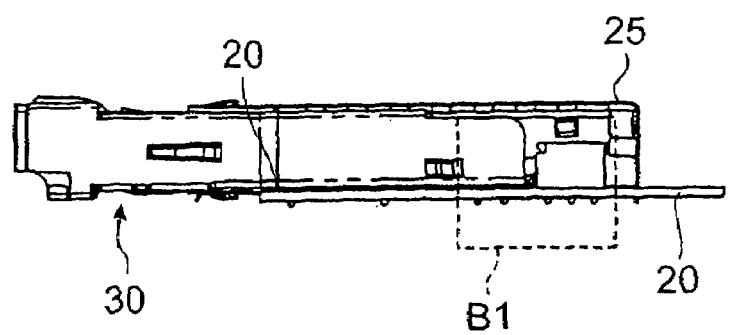
Figure 12B:
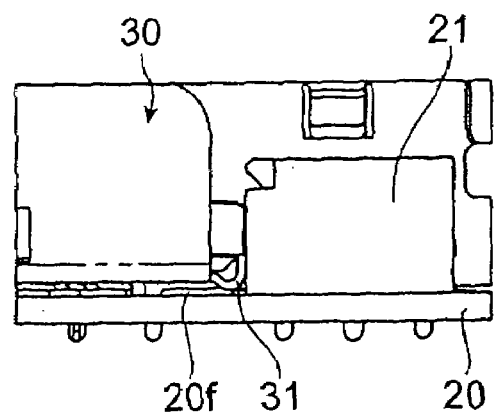
FIG. 12B is a partially enlarged view of FIG. 12A.
Figure 13A:
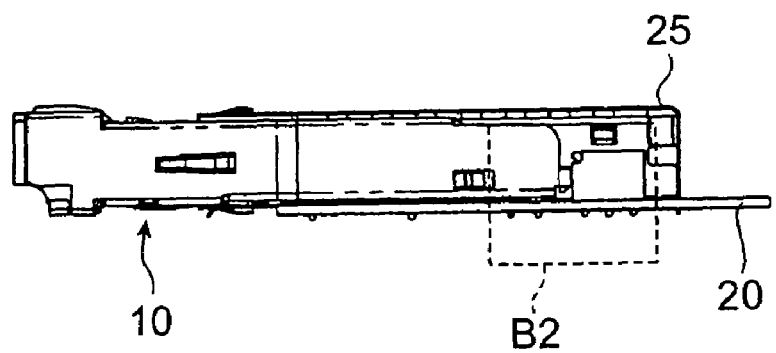
Figure 13B:
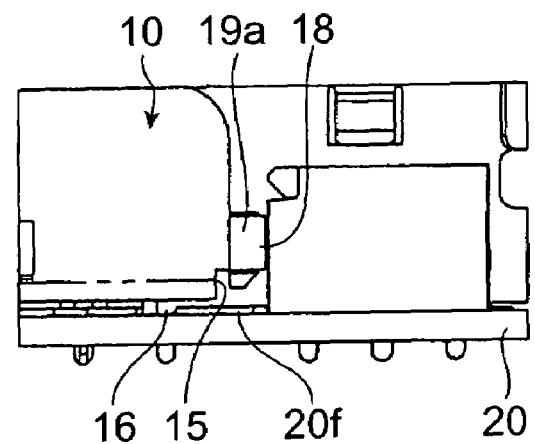
FIG. 13B is view partially enlarged view of FIG. 13A.

As shown in FIG. 10, the optical module 10 can be inserted upside down into the cage 25. FIG. 11 is a view showing a conventional optical module 30 with no stopper. FIG. 12A is a view showing the optical module 30 inserted upside down in the cage. FIG. 12B is an enlarged view of the region B1 shown in FIG. 12A. FIG. 13A is a view showing the optical module 10 according to the present invention, which is inserted upside down in the cage. FIG. 13B is an enlarged view of the region B2 shown in FIG. 13A.

As shown in FIG. 11, the metal cover of the optical module 30 does not have any stopper, and an edge 31 of the ceiling of the cover is located at the rear end of the optical module 30. This edge 31 protrudes upward at the rear end of the optical module 30.

If the optical module 30 is inserted upside down into the cage 25, the edge 31 of the optical module 30 comes into contact with the conductive patterns 20f on the host board 20 as shown in FIG. 12B. Since the host board 20 has already been fed with power, a short circuit occurs between the metal end 31 of the optical module 30 and the conductive patterns 20f through the edge 31.

By contrast, as shown in FIG. 13B, the optical module 10 has the stopper 18 formed integrally with the electrically conductive cover 16. If the optical module 10 is inserted upside down into the cage 25, the stopper 18 prevents the conductive patterns 20f from coming into contact with the electrically conductive cover 16. If the optical module 10 is inserted in the correct orientation thereof, the circuit board 14 is connected to the connector 21 and the stopper 18 does not prevent this connection.

Figure 14:
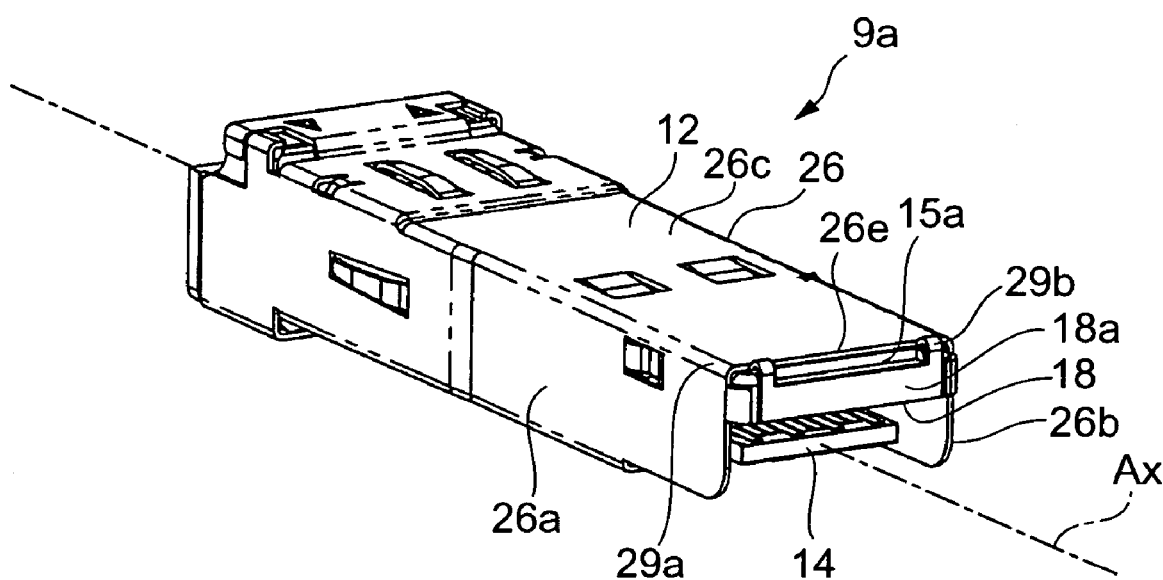
FIG. 14 is a perspective view showing the rear of a modified optical module according to the first embodiment.

FIG. 14 is a view showing a modified optical module according to the first embodiment. This optical module 9a has a metal cover 26 in place of the cover 16. The cover 26 has a ceiling 26c with first and second projections 29a and 29b. The projections 29a and 29b are provided not at the side walls 26a and 26b but at an edge 26e of the ceiling 26c. The stopper 18 projects rearward from the ceiling 26c and is exterior to the rear end 26e. If the optical module 10 is inserted upside down into the cage 25, the stopper 18 reaches the connector 21 before the rear end 26e of the ceiling 26c reaches the connector 21, so that the end face 18a of the stopper 18 comes into contact with the connector 21.

In the optical module 9a, a step is provided at an edge 15a forms a gap between the projections 29a and 29b.

Figure 15A:
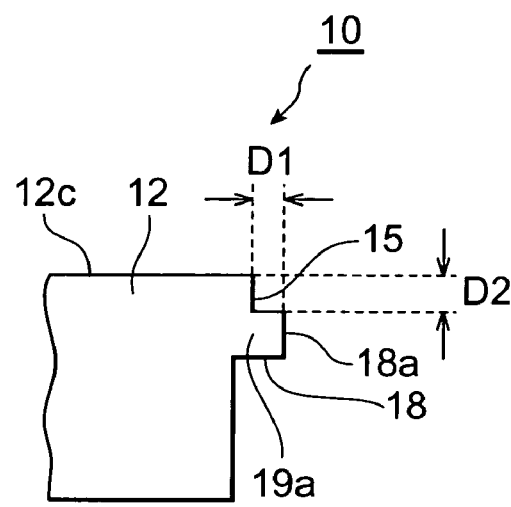
Figure 15B:
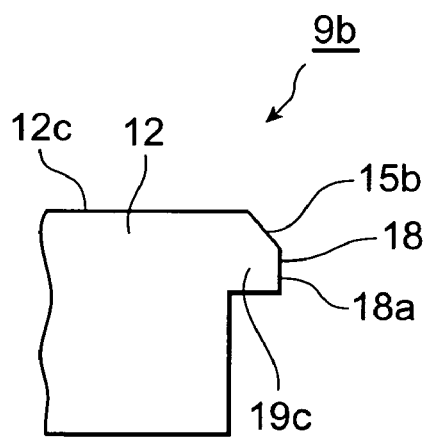
FIGS. 15B and 15C are perspective views each showing the rear of a modified optical module.
Figure 15C:
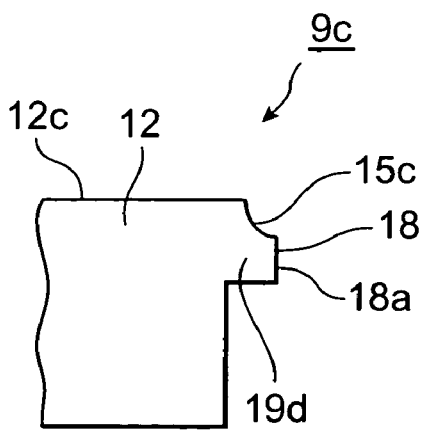

FIG. 15A is a side view showing the rear end of the optical module 10 according to the first embodiment. The length D1 of the projections is preferably at least 1.5 mm, for example. The depth D2 of the step between the stopper 18 and the ceiling 16c is preferably at least 0.5 mm, for example. FIGS. 15B and 15C are side views each showing a modified optical module according to the first embodiment. In the optical module 9b, a projection 19c has a tilt between the ceiling 16c and stopper 18. In the optical module 9c shown in FIG. 15C, a projection 19d has a curve extending from an edge of the ceiling 16c to an edge of the stopper 18.

Second Embodiment

Figure 16:
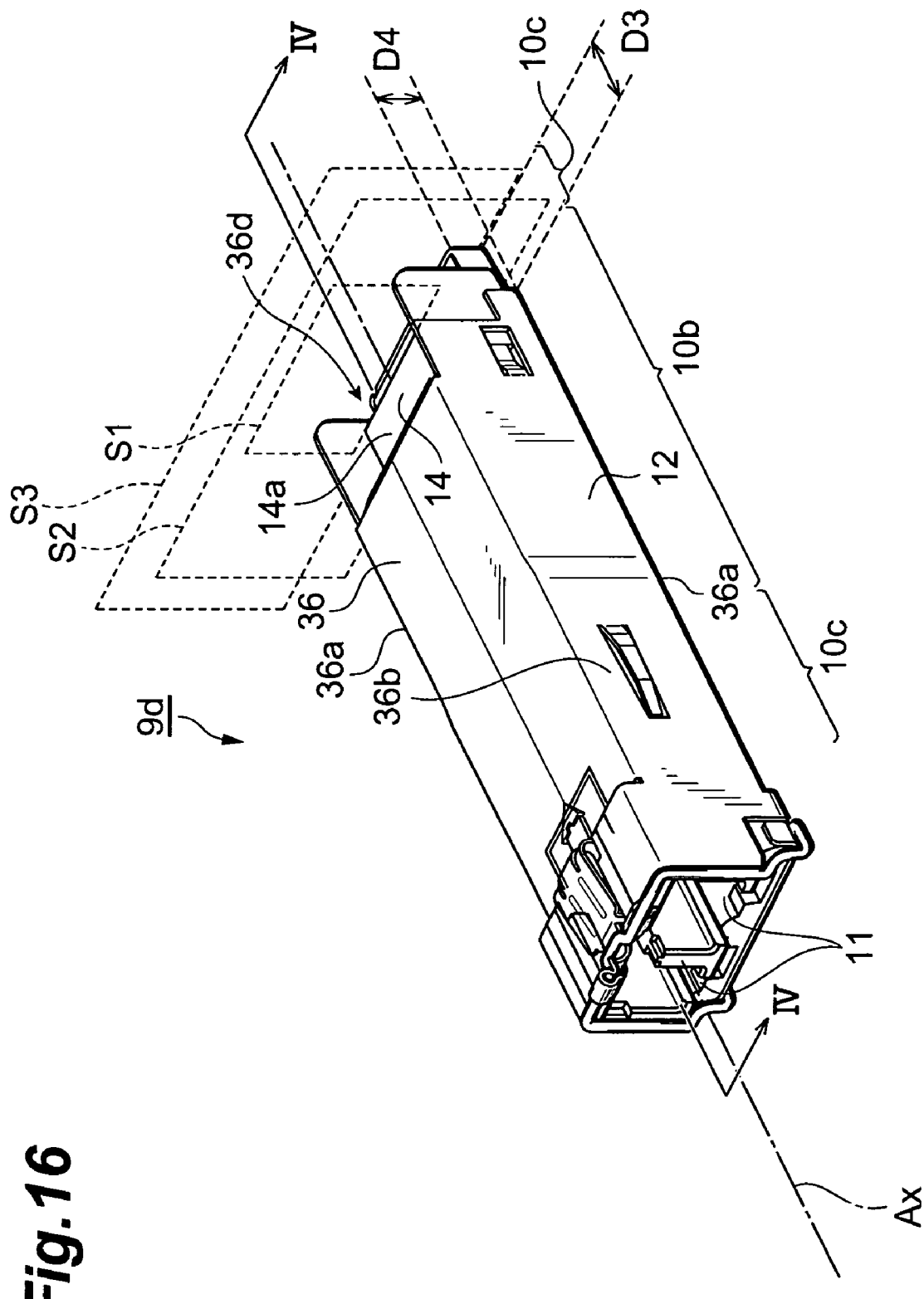
FIG. 16 is a perspective view showing an optical module according to a second embodiment.
Figure 17:
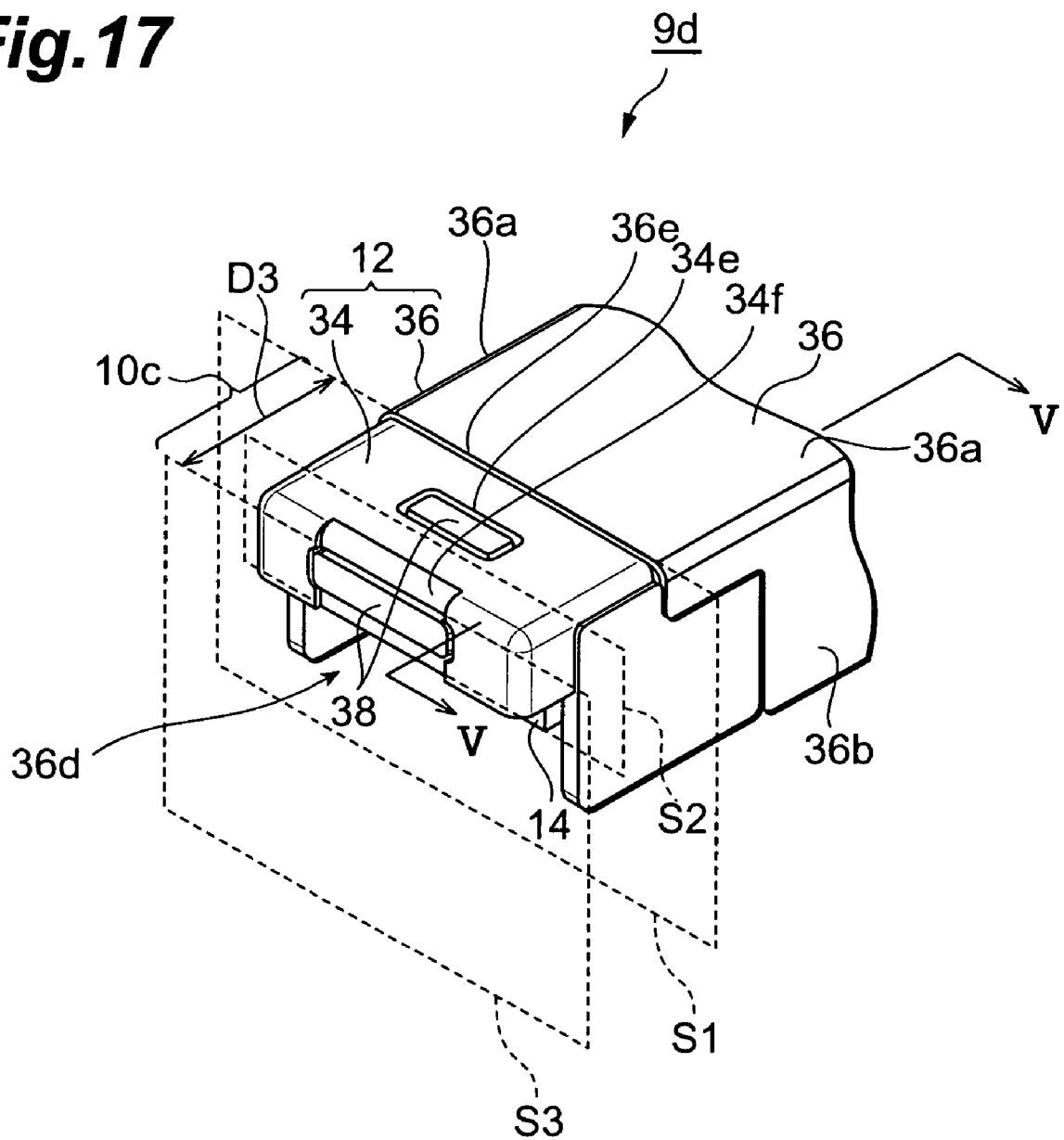
FIG. 17 is a perspective view showing the rear of the optical module according to the second embodiment.

FIG. 16 is a perspective view showing the bottom of an optical module 9d. FIG. 17 is a perspective view showing a rear end of the optical module 9d.

The optical module 9d includes a housing 12 having an insulating member 34 and a metal cover 36. The insulating member 34 constitutes the rear end of the housing 12. The ceiling 36c of the cover and the insulating member 34 extend along a predetermined plane.

The rear end 14b of the circuit board 14 is located on a first reference plane S1. The rear end of the ceiling 36c is located on a second reference plane S2. The rear end of the insulating member 34 is located on a third reference plane S3. The third reference plane S3 is behind the first reference plane S1 and the second reference plane S2.

If the optical module 9d is inserted upside down into the cage 25, the rear end of the insulating member 34 reaches the connector 21 before the rear end of the ceiling 36c contacts with the conductive patterns 20f of the host board 20.

Referring to FIG. 17, the width D3 of the insulating member 34 in the optical module 9d is preferably at least 1.5 mm but not greater than 8.0 mm, for example. The height D4 of the rear end face of the insulating member 34 is preferably at least 0.5 mm but not greater than 3.3 mm, for example. The insulating member 34 may be attached to the cover 36.

The insulating member 34 has openings 34e and 34f, and a block 38 appears at the openings 34e and 34f. The heat generated by the optical module 9d is transmitted to the cover 36 by way of the metal block 38.

The cover 36 can be used as the metal block 38. That is, the ceiling 36c appears at the opening 34e of the insulating member 34, and the rear wall of the cover 36 appears at the opening 34f.

The insulating member 34 may be made of resin, for example. The insulating member 34 may be an insulating coating film provided on the cover 36.

Figure 18:
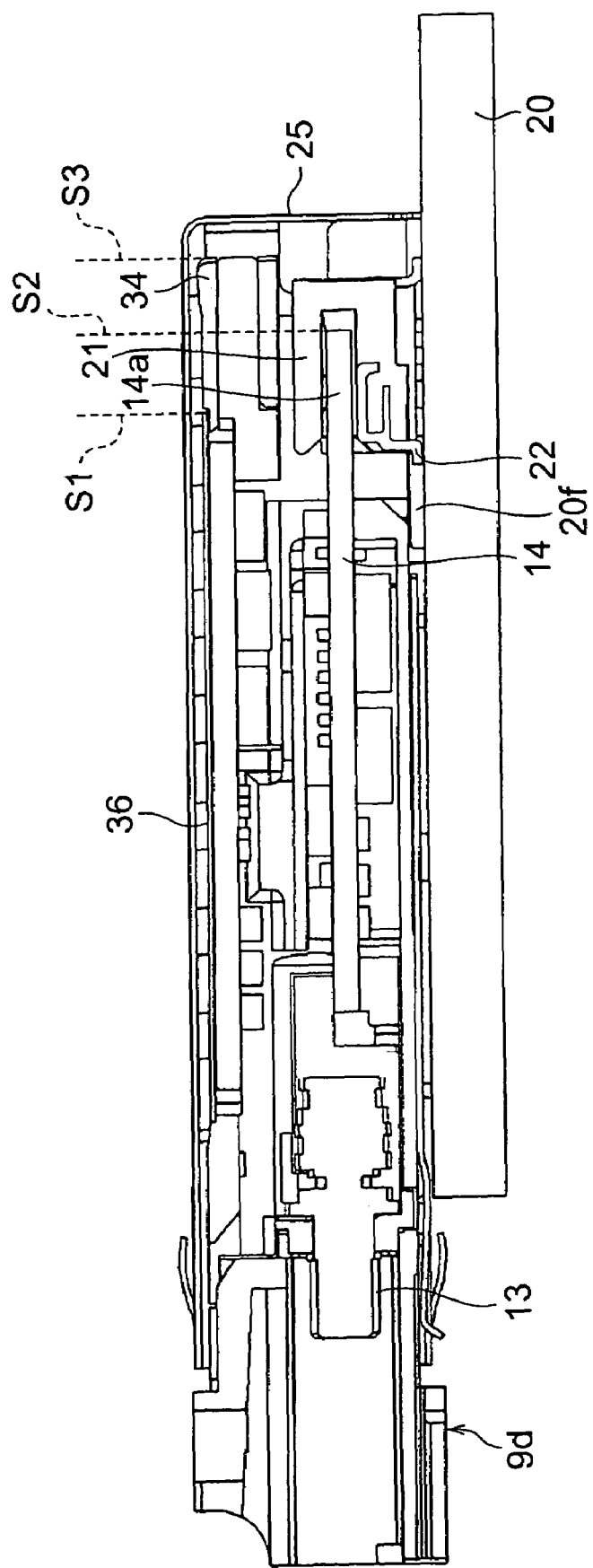
FIG. 18 is a sectional view showing a host board and the optical module connected thereto.
Figure 19:
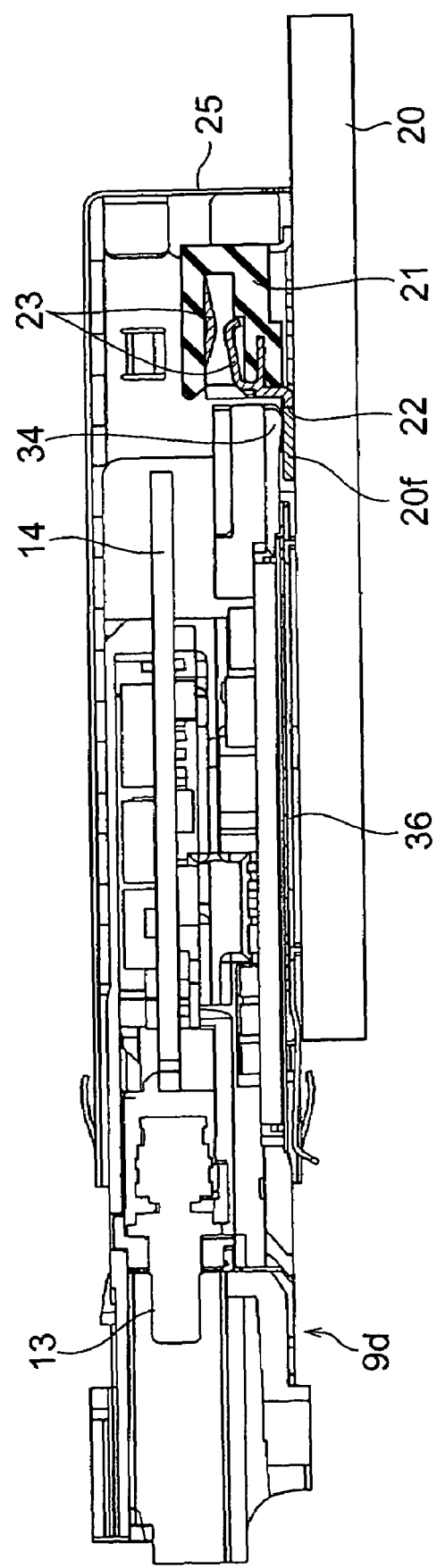
FIG. 19 is a sectional view showing the cage and the optical module inserted upside down therein.

FIG. 18 is a sectional view showing the connector and optical module according to the second embodiment. FIG. 19 is a sectional view showing the optical module 9d inserted upside down in the cage.

Referring to FIG. 18, if the optical module 9d is correctly inserted into the cage 25, the rear end 14a of a circuit board in the optical module 9d is mated with the connector 21, and the optical module 9d is electrically connected to the host board 20 via the leads 22.

When the optical module 9d is inserted upside down in the cage 25 as shown in FIG. 19, the insulating member 34 provided at the rear end of the optical module 9d makes contact with the connector 21, whereby the optical module 9d is not completely inserted into the cage 25. As shown in FIG. 19, the insulating member 34 abuts against the host connector 21, thereby preventing the conductive patterns 20f from coming into contact with the electrically conductive cover 36.

What is claimed is:

1. An optical module inserted into a cage containing a connector electrically connected to a conductive wiring on a host board, the cage, the connector and the conductive wiring being provided on the host board, the optical module comprising:

a circuit board having a card edge connector at a rear edge thereof, the card edge connector mating with the connector on the host board; and a housing having a conductive ceiling with a rear edge and a pair of side walls, the housing installing the circuit board therein, the side walls supporting a stopper supported in both ends thereof, the stopper protruding from the rear edge of the circuit board and the rear edge of the conductive ceiling to make a gap to the rear edge of the conductive ceiling, the gap extending from the side walls to the other side walls.

2. The optical module according to claim 1, wherein the stopper is provided between the conductive ceiling and the circuit board.

3. The optical module according to claim 1,
wherein the sides provide a first projection and a second projection in a rear edge thereof, and the stopper has one end connected to the first projection and another end connected to the second projection such that the stopper makes the gap to the rear edge of the ceiling, the gap extending from one of the sides of the housing to the other of the sides of the housing, and
wherein the first projection, the second projection and the stopper are integrally formed.

4. An optical module inserted into a cage containing a connector electrically connected to a conductive wiring on a host board, the cage, the connector and the conductive wiring being provided on the host board, the optical module comprising:
a circuit board having a card edge connector at a rear end thereof, the card edge connector mating with the connector on the host board;
a housing for installing the circuit board therein, the housing having a conductive ceiling with a rear end and a pair of side walls; and
a stopper supported by the pair of side walls in each end thereof so as to make a gap to the rear end of the conductive ceiling, the gap extending from one of the side walls to the other of the side walls,
wherein the stopper abuts against the connector before the rear end of the conductive ceiling comes in contact with the conductive wiring on the host board when the optical module is inserted upside down into the cage.

5. The optical module according to claim 4,
wherein the stopper protrudes from the rear end of the circuit board.

6. The optical module according to claim 4,
wherein the stopper is supported by the pair of side walls through projections provided in a rear end of respective side walls to make the gap.

7. The optical module according to claim 4,
wherein the conductive ceiling forms projections in both sides of the rear end thereof, the stopper being supported by the conducive ceiling through the projection.

* * * * *